(12) United States Patent
Wang

(10) Patent No.: US 8,981,865 B2
(45) Date of Patent: Mar. 17, 2015

(54) FIRST AND SECOND DIFFERENTIAL TRANSMISSION LINES WHERE THE SECOND TRANSMISSION LINE INCLUDES BENT PORTIONS TO SURROUND THE FIRST TRANSMISSION LINE

(71) Applicant: Hon Hai Precision Industry Co., Ltd., New Taipei (TW)

(72) Inventor: Shao-Wei Wang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 119 days.

(21) Appl. No.: 13/688,408

(22) Filed: Nov. 29, 2012

(65) Prior Publication Data
US 2014/0085018 A1 Mar. 27, 2014

(30) Foreign Application Priority Data
Sep. 27, 2012 (TW) .............................. 101135513 A

(51) Int. Cl.
*H01P 3/02* (2006.01)
*H04B 3/02* (2006.01)
*H05K 1/02* (2006.01)

(52) U.S. Cl.
CPC ................ *H04B 3/02* (2013.01); *H05K 1/0245* (2013.01)
USPC .................................................. 333/4; 333/5

(58) Field of Classification Search
CPC ............. H01P 3/02; H01P 3/026; H01P 3/04; H05K 1/0245
USPC ........................................................ 333/1, 4, 5
See application file for complete search history.

(56) References Cited

U.S. PATENT DOCUMENTS 7,298,229 B1 * 11/2007 Ruelke .......................... 333/116

FOREIGN PATENT DOCUMENTS

TW          M383212        6/2010

* cited by examiner

*Primary Examiner* — Benny Lee
(74) *Attorney, Agent, or Firm* — Novak Druce Connolly Bove + Quigg LLP

(57) ABSTRACT

An exemplary transmission line system is provided. The system includes a first transmission line partially arranged on a first layer of a PCB including first structure units and partially arranged on a third layer of the PCB including second structure units, and a second transmission line arranged on a second layer of the PCB. Each first structure unit and each second structure respectively include a first connection line, a second connection line, and a first bent line; and a third connection line, a fourth connection line, and a second bent line. A second end of the first connection line and the second connection line of each of the first structure units are respectively connected to a second end of the third connection line and the fourth connection line of the adjacent second structure unit through respective vias.

6 Claims, 7 Drawing Sheets

FIRST AND SECOND DIFFERENTIAL TRANSMISSION LINES WHERE THE SECOND TRANSMISSION LINE INCLUDES BENT PORTIONS TO SURROUND THE FIRST TRANSMISSION LINE

BACKGROUND

Technical Field

The present disclosure relates to transmission line systems and, more particularly, to a transmission line system capable of simultaneously transmitting a common signal at a frequency and a differential signal at another frequency.

A known transmission line system can simultaneously transmit a common-mode signal and a differential-mode signal at the same frequency. However, the same frequency of the common-mode signal and the differential-mode signal cannot be used together. Thus, when the common-mode signal or the differential-mode signal is in use, another electronic component is employed to filter the differential-mode signal or the common-mode signal not in use, which increases the cost of transmitting the signal. Therefore, it is desired to provide a transmission line system to resolve the above problem.

BRIEF DESCRIPTION OF THE DRAWINGS

The components in the drawings are not necessarily drawn to scale, the emphasis instead being placed upon clearly illustrating the principles of the transmission line system. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one" embodiment.

Figure 1:
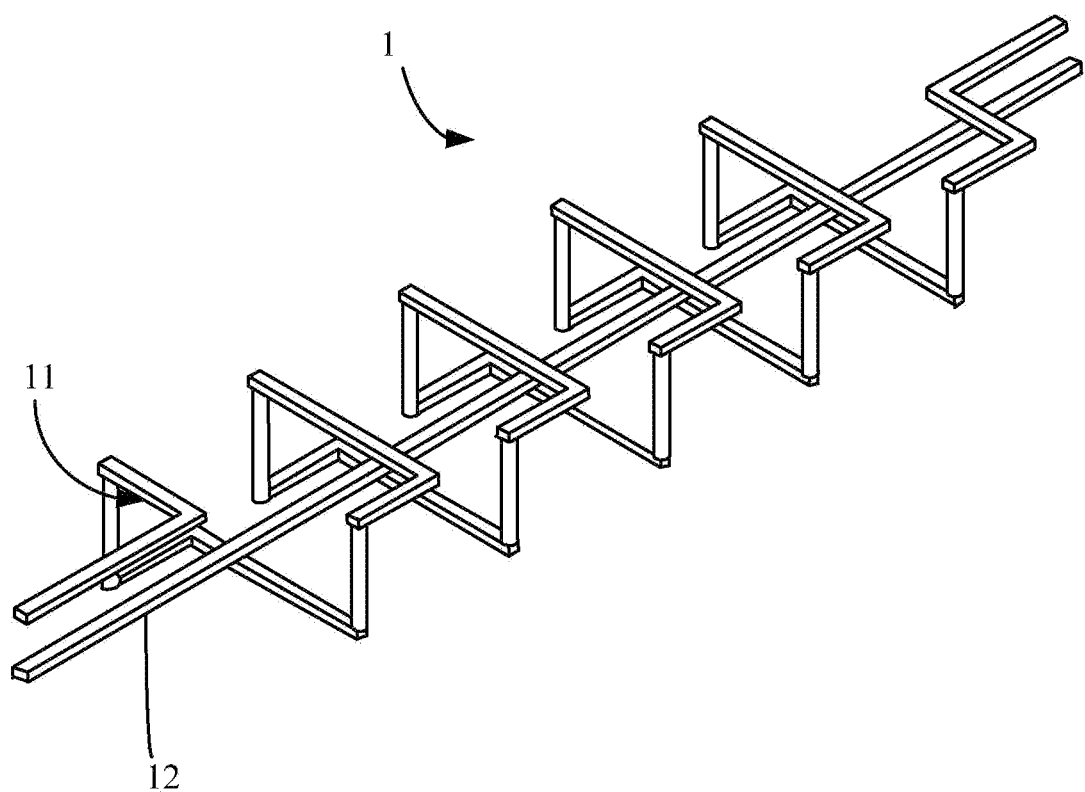
FIG. 1 is a schematic view of a transmission line system, in accordance with an exemplary embodiment.
Figure 2:
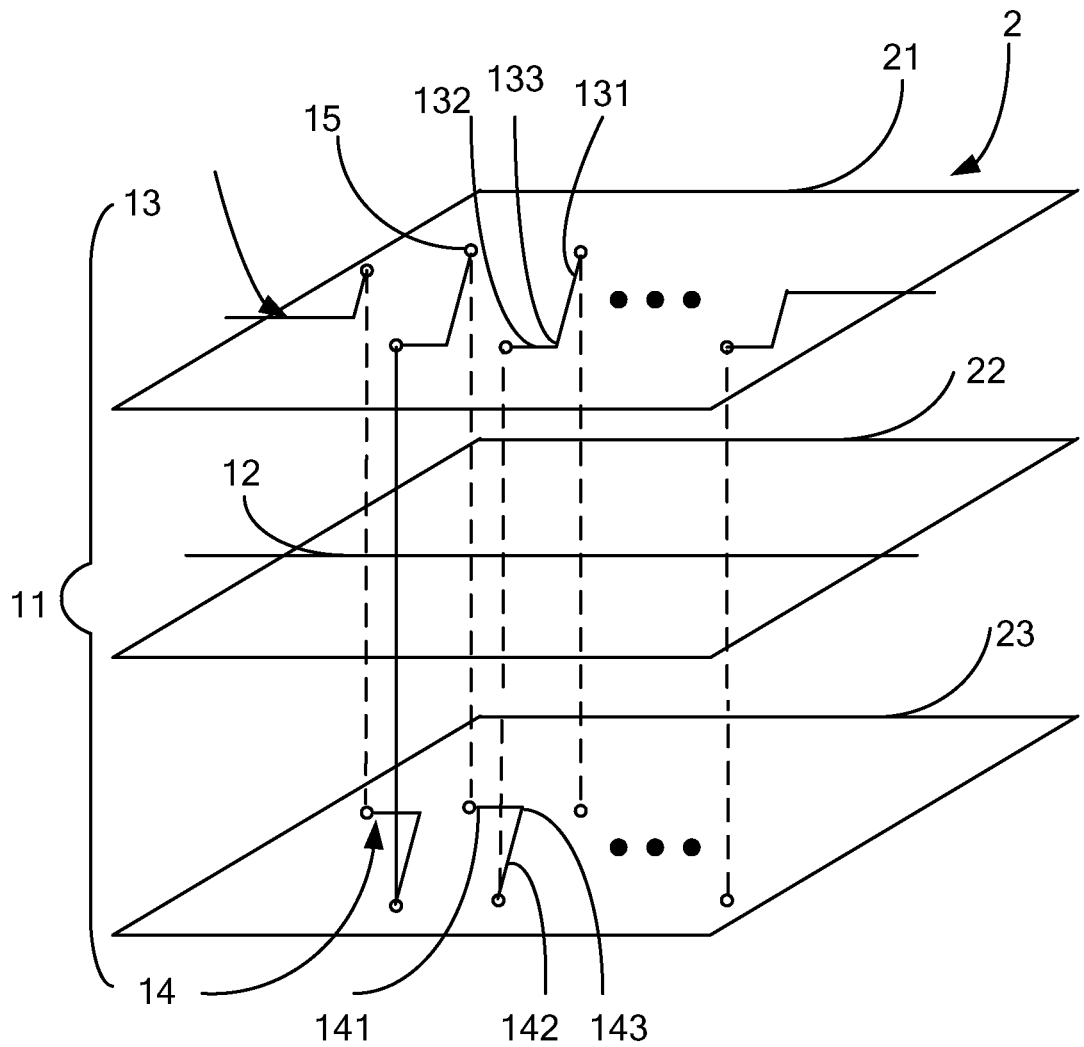
FIG. 2 is a schematic view showing the transmission line system of the FIG. 1 arranged on a printed circuit board (PCB), in accordance with an exemplary embodiment.

FIG. 1 and FIG. 2 show a transmission line system 1 of an embodiment. The transmission line system 1 (FIG. 1) is arranged on a printed circuit board (PCB) 2 (FIG. 2). The PCB 2 includes a first layer 21, a second layer 22, and a third layer 23 in sequence, as shown in FIG. 2. The transmission line system 1 includes a first transmission line 11 and a second transmission line 12. As shown in FIG. 2, one part of the first transmission line 11 is arranged on the first layer 21. Another part of the first transmission line 11 is arranged on the third layer 23. The part of the first transmission line 11 arranged on the first layer 21 and the other part of the first transmission line 11 arranged on the third layer 23 are alternately arranged and are connected from beginning to end in series to form the first transmission line 11. The second transmission line 12 is arranged on the second layer 22. The first transmission line 11 transmits a first signal from a signal source to a signal destination. The second transmission line 12 transmits a second signal from the signal source to the signal destination. The first signal and the second signal cooperatively form a differential-mode signal. The first signal and the ground, and the second signal and the ground cooperatively form a common-mode signal.

Figure 3:
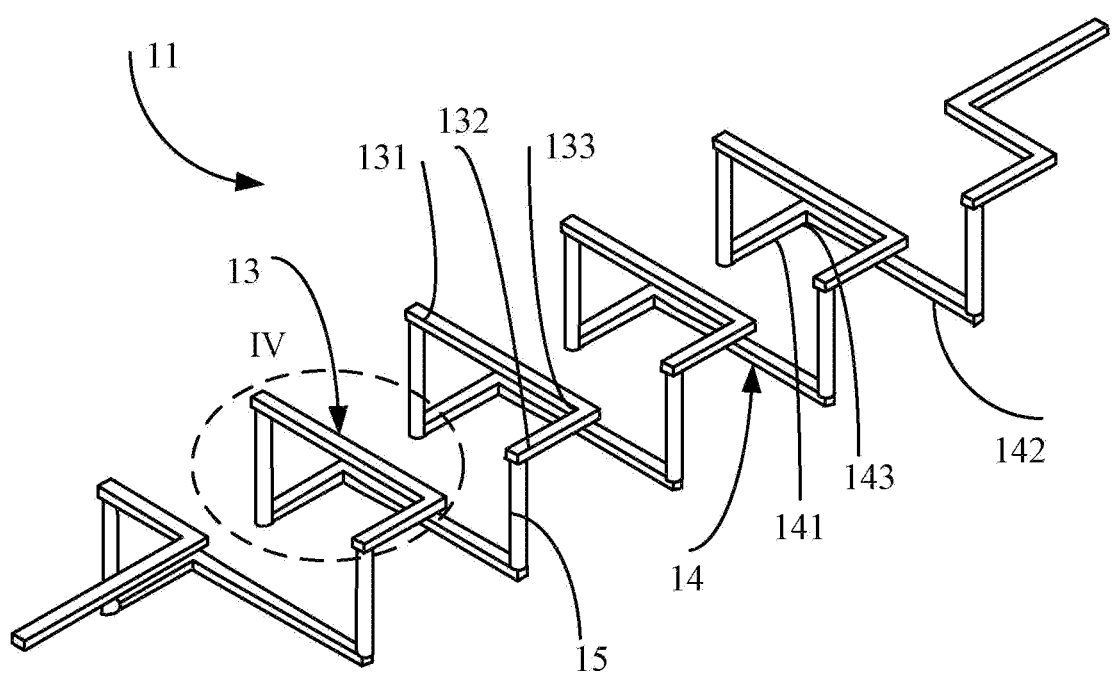
FIG. 3 is a schematic view of a first transmission line of the transmission line system of the FIG. 1, in accordance with an exemplary embodiment.
Figure 4:
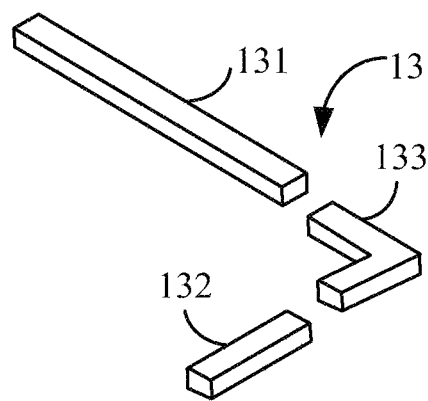
FIG. 4 is a partial, enlarged, exploded view of the circled portion IV of FIG. 3.

FIG. 3 and FIG. 4 show the part of the first transmission line 11 (FIG. 3) arranged on the first layer 21 (FIG. 2) including a number of first structure units 13 (FIG. 3). As shown in FIG. 3, each first structure unit 13 includes a first connection line 131, a second connection line 132, and a first bent line 133. The first connection line 131 and the second connection line 132 are straight lines. The first bent line 133 is a bent line. The first bent line 133 first end is connected to the first connection line 131 first end, and the first bent line 133 second end is connected to the second connection line 132 first end. The other part of the first transmission line 11 (FIG. 3) arranged on the third layer 23 (FIG. 2) includes a number of second structure units 14 (FIG. 3). As shown in FIG. 3, each second structure unit 14 includes a third connection line 141, a fourth connection line 142, and a second bent line 143. The third connection line 141 and the fourth connection line 142 are straight lines, and the second bent line 143 is a bent line. The second bent line 143 first end is connected to the third connection line 141 first end, and the second bent line 143 second end is connected to the fourth connection line 142 first end.

Figure 6:
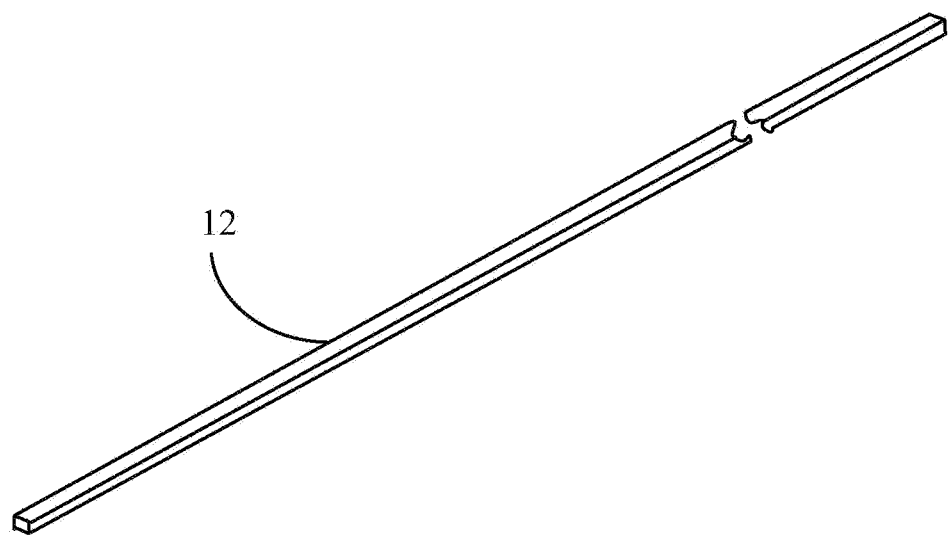
FIG. 6 is a schematic view of a second transmission line of the transmission line system of the FIG. 1, in accordance with an exemplary embodiment.

A number of vias 15 (FIGS. 2-3) extend through the second layer 22 (FIG. 2) of the PCB 2 (FIG. 2). Returning to FIG. 2, the first connection line 131 second end of each first structure unit 13 is connected to the third connection line 141 second end, of the adjacent second structure unit 14, through the via 15. The second connection line 132 second end of each first structure unit 13 is connected to the fourth connection line 142 second end, of the adjacent second structure unit 14, through the via 15. Thus, the first structure unit 13 arranged on the first layer 21 and the second structure unit 14 arranged on the third layer 23 are connected from beginning to end in series through the vias 15 to form the first transmission line 11 (see FIG. 3). In this way, the first transmission line 11 is arranged to surround the second transmission line 12. In the embodiment, the second transmission line 12 is a straight line (see FIG. 6).

In the embodiment, each third connection line 141 has a length that is the same as a length of each second connection line 132, and each fourth connection line 142 has a length that is the same as a length of each first connection line 131. Each first bent line 133 and each second bent line 143 are L-shaped, thus each first structure unit 13 and each second structure unit 14 are "L-shaped" as shown in FIGS. 2-3. When the arrangement of each first bent line 133 is rotated about 90 degree anticlockwise, the arrangement of each second bent line 143 is parallel to the arrangement of each rotated first bent line 133. The vias 15 perpendicularly extend through the second layer 22 of the PCB 2.

Figure 5:
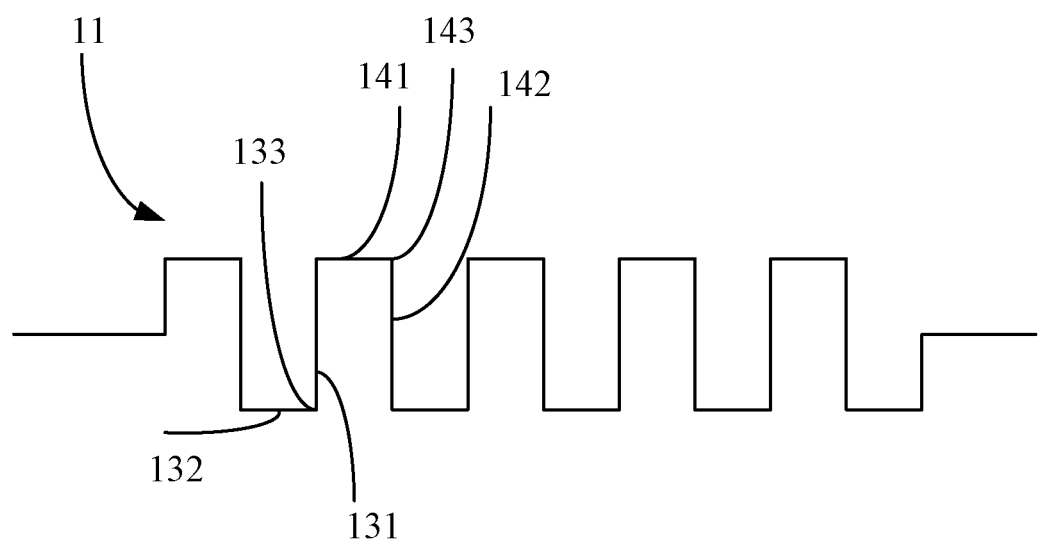
FIG. 5 is an illustrating view showing the projection of the first transmission line of the FIG. 3 on a plane parallel to the PCB of FIG. 2, in accordance with an exemplary embodiment.

FIG. 5 shows that the projection point of the second end of the first connection line 131 of each first structure unit 13 (FIGS. 2-4) on a plane parallel to the PCB 2 (FIG. 2) is the same point as the projection point of the second end of the third connection line 141 of the adjacent second structure unit 14 (FIGS. 2-3) on the plane parallel to the PCB 2 (FIG. 2). And the projection point of the second end of the second connection line 132 of each first structure unit 13 (FIGS. 2-4) on the plane parallel to the PCB 2 (FIG. 2) is the same point as the projection point of the second end of the fourth connection line 142 of the adjacent second structure unit 14 (FIGS. 2-3) on the plane parallel to the PCB 2 (FIG. 2). Thus, the projection of the first transmission line 11 on the plane parallel to the PCB 2 (FIG. Q is a square wave shape.

Figure 7:
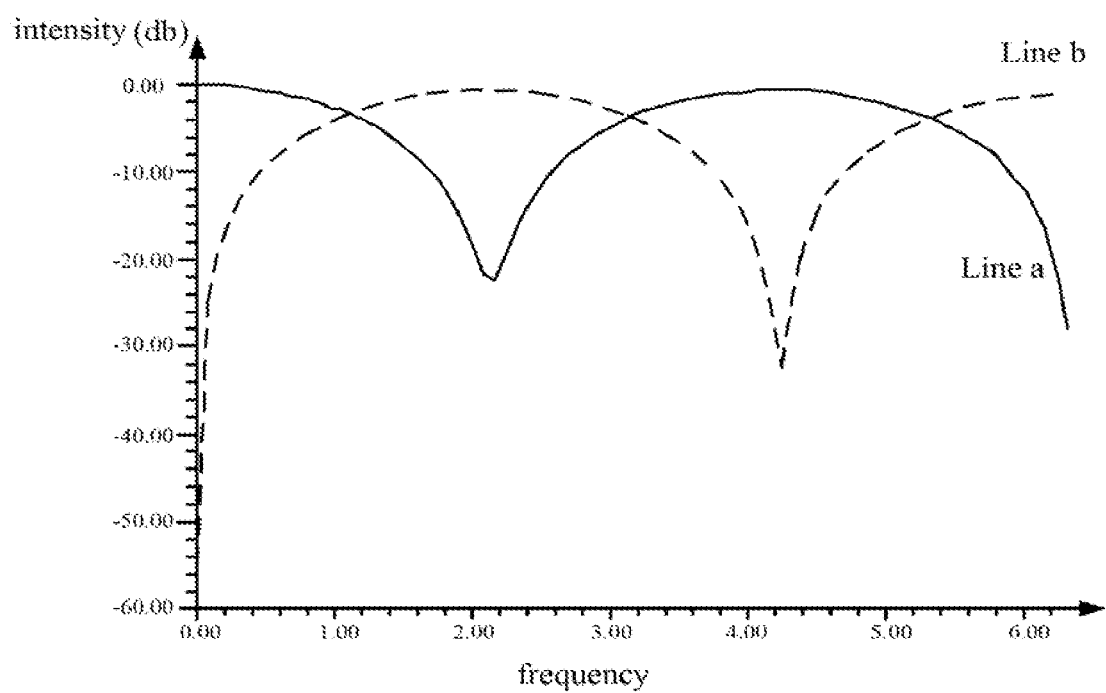
FIG. 7 is an illustrating view showing the transmission of the common signal and the differential signal in the transmission line system of FIG. 1, in accordance with an exemplary embodiment.

FIG. 7 is an illustrating view showing the common-mode signal and the differential-mode signal transmitting in the transmission line system 1 (FIG. 1). The transverse axis of the illustrating view represents the frequency. The longitudinal axis of the illustrating view represents the intensity of the signal in db. Line 'a' in the illustrating view shows the differential-mode signal transmitted in the transmission line system 1 (FIG. 1). Line 'b' in the illustrating view shows the common-mode signal transmitted in the transmission line system 1 (FIG. 1). When the intensity of the common-mode signal or the differential-mode signal at one frequency is less than −10 db, the common-mode signal or the differential-mode signal at that frequency can pass through the transmission line system 1 (FIG. 1); otherwise, the common-mode signal or the differential-mode signal at that frequency cannot pass through the transmission line system 1 (FIG. 1). In FIG. 7, the common-mode signal or the differential-mode signal at a same frequency can pass through the transmission line system 1 (FIG. 1), and the common-mode signal and the differential-mode signal at a different frequency can simultaneously pass through the transmission line system 1 (FIG. 1). With this configuration, the transmission line system 1 (FIG. 1) can transmit the common-mode signal or the differential-mode signal and can also simultaneously transmit the common-mode signal and the differential-mode signal at the different frequency. In this way, another electronic component which is configured to filter the unneeded differential-mode signal or the unneeded common-mode signal is not needed.

In one embodiment, the length of the first connection line 131 (FIGS. 2-5), the fourth connection line 142 (FIGS. 2, 3, 5), the second connection line 132 (FIGS. 2-5), and the third connection line 141 (FIGS. 2, 3, 5), or the length of the first connection line 131 (FIGS. 2-5) and the fourth connection line 142 (FIGS. 2, 3, 5), or the length of the second connection line 132 (FIGS. 2-5) and the third connection line 141 (FIGS. 2, 3, 5) can be varied to change the intensity of the common-mode signal and the differential-mode signal at each frequency.

Although the current disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A transmission line system arranged on a PCB which comprises a first layer, a second layer, and a third layer in sequence, the transmission line system comprising:

a first transmission line, one part of the first transmission line being arranged on the first layer of the PCB, other part of the first transmission line being arranged on the third layer of the PCB; the part of the first transmission line arranged on the first layer of the PCB comprising a plurality of first structure units, each of the plurality of first structure units comprising a first connection line, a second connection line, and a first bent line, each of the first connection lines and each of the second connection lines being straight lines, the first bent line first end being connected to the first connection line first end, and the first bent line second end being connected to the second connection line first end; the other part of the first transmission line, arranged on the third layer of the PCB, comprising a plurality of second structure units; each of the plurality of second structure units comprising a third connection line, a fourth connection line, and a second bent line; each of the third connection line and the fourth connection line being straight lines, the second bent line first end being connected to the third connection line first end, and the second bent line second end being connected to the fourth connection line first end; the first connection line second end of each of the plurality of first structure units being connected to the third connection line second end of the adjacent second structure unit through a respective via, and the second connection line second end of each of the plurality of first structure units being connected to the fourth connection line second end of the adjacent second structure unit through another respective via; and a second transmission line being a straight line arranged on the second layer of the PCB;

wherein each of the first bent lines and each of the second bent lines are "L-shaped", and the first transmission line and the second transmission line are configured to transmit signal which comprises at least one item selected from the group consisting of the common-mode signal and the differential-mode signal.

2. The transmission line system as described in claim 1, wherein the plurality of first structure units and the plurality of second structure units are each alternately arranged and are connected from beginning to end in series through the respective vias to form the first transmission line.

3. The transmission line system as described in claim 2, wherein the first transmission line surrounds the second transmission line.

4. The transmission line system as described in claim 1, wherein each of the plurality of first connection lines has a length that is the same as a length of each of the plurality of fourth connection lines, and each of the plurality of second connection lines has a length that is the same as a length of each of the plurality of third connection lines.

5. The transmission line system as described in claim 1, wherein the first transmission line and the second transmission line transmit either the common-mode signal or the differential-mode signal at a same frequency, and simultaneously transmit the common-mode signal and the differential-mode signal at a different frequency.

6. The transmission line system as described in claim 1, wherein a projection of the first transmission line on a plane parallel with the PCB is a square wave shape.

* * * * *